(12) United States Patent
Chou et al.

(10) Patent No.: US 9,703,301 B1
(45) Date of Patent: *Jul. 11, 2017

(54) METHODS AND CONTROL SYSTEMS OF RESISTANCE ADJUSTMENT OF RESISTORS

(71) Applicant: International Business Machines Corporation, Armonk, NY (US)

(72) Inventors: Anthony I. Chou, Beacon, NY (US); Arvind Kumar, Beacon, NY (US); Sungjae Lee, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/190,254

(22) Filed: Jun. 23, 2016

Related U.S. Application Data

(63) Continuation of application No. 14/990,034, filed on Jan. 7, 2016, now Pat. No. 9,400,511.

(51) Int. Cl.
*G05D 23/20* (2006.01)
*G05D 23/24* (2006.01)
*G01K 7/16* (2006.01)

(52) U.S. Cl.
CPC ............... *G05D 23/24* (2013.01); *G01K 7/16* (2013.01)

(58) Field of Classification Search
None
See application file for complete search history.

(56) References Cited

U.S. PATENT DOCUMENTS

| | | | | |
|---|---|---|---|---|
| 5,515,682 | A | * 5/1996 | Nagakubo | F25B 21/04 |
| | | | | 165/259 |
| 7,337,661 | B2 | * 3/2008 | Yamada | G01F 1/692 |
| | | | | 73/204.15 |

(Continued)

OTHER PUBLICATIONS

Chou et al., "Methods and Control Systems of Resistance Adjustment of Resistors", U.S Appl. No. 14/990,034, filed Jan. 7, 2016.

(Continued)

*Primary Examiner* — Thomas J Hiltunen
(74) *Attorney, Agent, or Firm* — Cantor Colburn LLP; Steven Meyers (57) ABSTRACT

Embodiments include methods, computer systems and computer program products for controlling resistance value of a resistor in a circuit. Aspects include: retrieving, via a controller, a set of parameters of the resistor from a non-volatile memory in the circuit, detecting, via the controller, an operating temperature of the resistor during circuit operation in field using a temperature sensor, generating, by the controller, a temperature difference between the operating temperature detected and a target temperature at which the resistor has a target resistance value, producing, by the controller, a control signal responsive to the temperature difference generated, and transmitting the control signal to a temperature regulator placed adjacent to the resistor to adjust the resistance value of the resistor. The resistance value of the resistor varies in response to temperature changes around the resistor according to a temperature coefficient of the resistance of the resistor.

15 Claims, 4 Drawing Sheets

(56) References Cited

U.S. PATENT DOCUMENTS

| | | | | |
|---|---|---|---|---|
| 7,442,902 | B2* | 10/2008 | Stearns | G01N 30/30 |
| | | | | 219/490 |
| 7,555,829 | B2* | 7/2009 | Grudin | H01C 17/232 |
| | | | | 219/494 |
| 7,755,230 | B2* | 7/2010 | Nakahara | G01K 7/42 |
| | | | | 310/53 |
| 8,022,717 | B2* | 9/2011 | Grudin | G01R 19/32 |
| | | | | 324/691 |
| 8,306,773 | B2* | 11/2012 | Hasson | B01L 7/525 |
| | | | | 702/133 |
| 9,230,720 | B2* | 1/2016 | Santangelo | H01C 10/50 |
| 9,400,511 | B1* | 7/2016 | Chou | G05D 23/24 |
| 2015/0355034 | A1* | 12/2015 | Cho | G01K 7/18 |
| | | | | 374/1 |
| 2016/0138978 | A1* | 5/2016 | Eberlein | G01K 7/01 |
| | | | | 374/170 |

OTHER PUBLICATIONS

List of IBM Patents or Patent Applications Treated as Related; (Appendix P), Filed Jun. 23, 2016; 2 pages.

* cited by examiner

METHODS AND CONTROL SYSTEMS OF RESISTANCE ADJUSTMENT OF RESISTORS

DOMESTIC PRIORITY

This application is a continuation of and claims priority from U.S. patent application Ser. No. 14/990,034, filed on Jan. 7, 2016, entitled "METHODS AND CONTROL SYSTEMS OF RESISTANCE ADJUSTMENT OF RESISTORS", the entire contents of which are incorporated herein by reference.

BACKGROUND

The present disclosure relates generally to integrated circuits, and more particularly to methods and control systems of resistance adjustment of resistors.

Resistors are important components of many analog electronic circuits, digital electronic circuits, discrete electronic circuits, and integrated circuits (IC). During the production of these resistors, variations in the resistance values of these resistors are generally unavoidable. These variations may cause performance variations for the corresponding electronic circuits, or differences of outputs of these electronic circuits. For example, performance variation of a high-speed analog circuit such as differential amplifier with a resistive load are mainly determined by the process, voltage, and temperature (PVT) variations of the precision resistors used in such high-speed analog circuit. Consistent and precise resistance values of the resistors used in these electronic circuits ensure consistent, reliable and dependable performance of these electronic circuits.

Therefore, heretofore unaddressed needs still exist in the art to address the aforementioned deficiencies and inadequacies.

SUMMARY

In an embodiment of the present invention, a method for controlling a resistance value of a resistor in a circuit may include: retrieving, via a controller, a set of parameters of the resistor from a non-volatile memory in the circuit, detecting, via the controller, an operating temperature of the resistor during circuit operation in field using a temperature sensor, generating a temperature difference between the operating temperature detected and a target temperature at which the resistor has a target resistance value, producing, via the controller, a control signal responsive to the temperature difference generated, and applying the control signal to a temperature regulator placed adjacent to the resistor to adjust the resistance value of the resistor. The resistance value of the resistor varies in response to temperature changes around the resistor according to a temperature coefficient of the resistance of the resistor. In certain embodiments, the temperature regulator may include a field effect transistor (FET) for changing temperature in response to the control signal received from the controller, and a front end of the line (FEOL) cooler for changing temperature in response to the control signal received from the controller.

In another embodiment of the present invention, a control system for adjusting a resistance value of a resistor in a circuit is provided. In certain embodiments, the control system may include the resistor, and a controller. The resistance value of the resistor varies in response to temperature changes around the resistor according to the temperature coefficient of the resistance of the resistor. In certain embodiments, the controller is configured to: retrieve the set of parameters of the resistor from the non-volatile memory in the circuit, detect an operating temperature of the resistor during circuit operation in field, generate a temperature difference between the operating temperature and a target temperature at which the resistor has the target resistance value, produce a control signal responsive to the temperature difference generated, and apply the control signal to a temperature regulator placed adjacent to the resistor to adjust the resistance value of the resistor.

In yet another embodiment of the present invention, the present disclosure relates to a non-transitory computer storage medium. In certain embodiments, the non-transitory computer storage medium stores instructions. When these instructions are executed by a controller in a circuit, these instructions cause the controller to perform: retrieving a set of parameters of a resistor from a non-volatile memory in the circuit, detecting an operating temperature of the resistor during circuit operation in field, generating a temperature difference between the operating temperature and a target temperature at which the resistor has a target resistance value, producing a control signal responsive to the temperature difference generated, and applying the control signal to a temperature regulator placed adjacent to the resistor to adjust the resistance value of the resistor.

These and other aspects of the present disclosure will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

The present disclosure is more particularly described in the following examples that are intended as illustrative only since numerous modifications and variations therein will be apparent to those skilled in the art. Various embodiments of the disclosure are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in"

includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. It will be appreciated that same thing can be said in more than one way. Consequently, alternative language and synonyms may be used for any one or more of the terms discussed herein, nor is any special significance to be placed upon whether or not a term is elaborated or discussed herein. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

As used herein, "plurality" means two or more. The terms "comprising," "including," "carrying," "having," "containing," "involving," and the like are to be understood to be open-ended, i.e., to mean including but not limited to.

The term computer program, as used above, may include software, firmware, and/or microcode, and may refer to programs, routines, functions, classes, and/or objects. The term shared, as used above, means that some or all code from multiple modules may be executed using a single (shared) processor.

The term "TCR" is temperature coefficient of resistance of a resistor.

The term "CML" stands for current mode logic, and it is generally used to represent differential amplifier having current source for biasing, pair of transistors and their corresponding load resistors to amplify differential signal.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The present disclosure will now be described more fully hereinafter with reference to the accompanying drawings FIGS. 1-4, in which certain exemplary embodiments of the present disclosure are shown. The present disclosure may, however, be embodied in many different forms and should not be construed as limited to the embodiments set forth herein; rather, these embodiments are provided so that this disclosure will be thorough and complete, and will fully convey the scope of the disclosure to those skilled in the art.

Resistors are usually important components of any analog electronic circuits, digital electronic circuits, discrete electronic circuit, and integrated circuits (IC). During the production of these resistors either as discrete components, or as a part of an integrated circuit, variations in resistance values of these resistors are generally unavoidable. These variations may cause performance variations for the corresponding electronic circuits, or differences of outputs of these electronic circuits. For example, performance variation of a high-speed analog circuit such as differential amplifier with resistive load are mainly determined by the process, voltage, and temperature (PVT) variations of precision resistors used in such high-speed analog circuit. Consistent and precise resistance values of the resistors used in these electronic circuits ensure consistent, reliable and dependable performance of these electronic circuits.

Since the variations in resistance values of these resistors are generally unavoidable during the production process, it is desirable to have certain built-in mechanism to compensate the variations to ensure the resistance values are consistent and precise when the resistors are used during circuit operation in field.

A temperature coefficient describes the relative change of a physical property that is associated with a given change in temperature. For a property resistance R that changes by dR when the temperature changes by dT, the temperature coefficient $\alpha$ is defined by $$dR/R = \alpha dT.$$

wherein $\alpha$ has the dimension of an inverse temperature and can be expressed e.g. in 1/K or $K^{-1}$.

If the temperature coefficient itself does not vary too much with temperature, a linear approximation can be used to determine the value R of a property at a temperature T, given its value $R_0$ at a reference temperature $T_0$:

$$R(T) = R(T_0)(1 + \alpha \Delta T),$$

where $\Delta T$ is the difference between T and $T_0$. For strongly temperature-dependent $\alpha$, this approximation is only useful for small temperature differences $\Delta T$.

Figure 1:
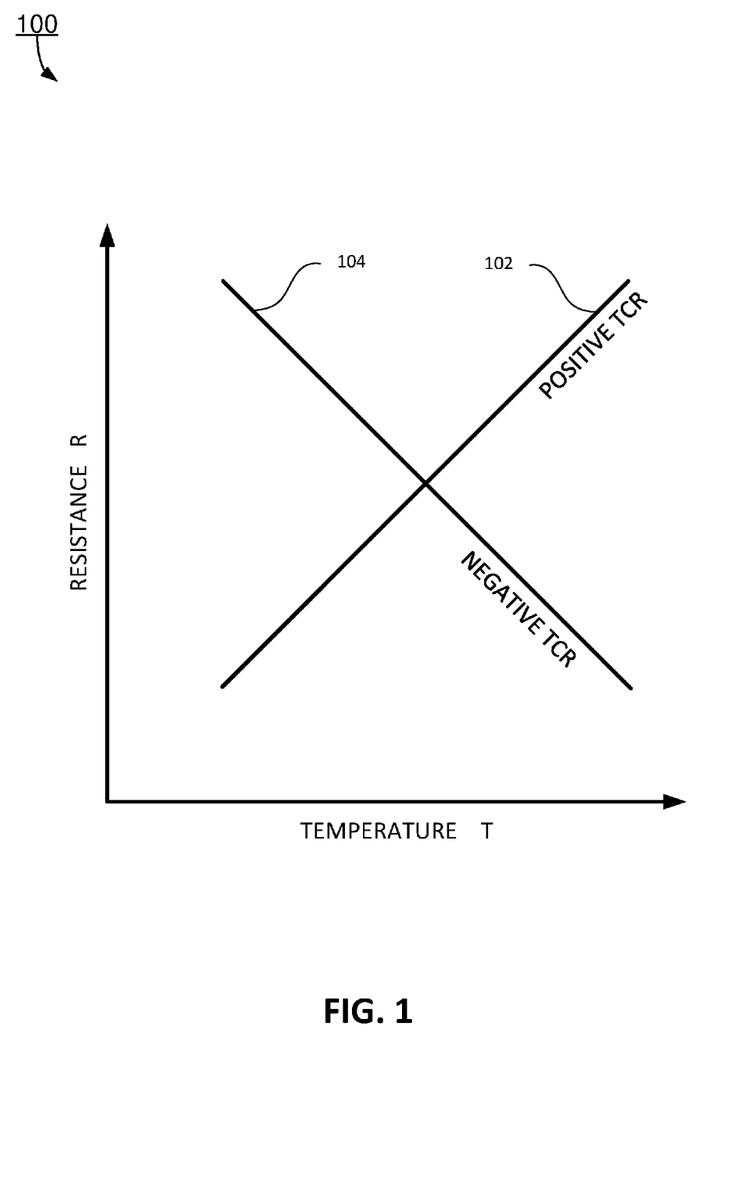
FIG. 1 is a graphical illustration of a positive temperature coefficient of resistance (TCR) of a resistor and a negative TCR of another resistor in accordance with exemplary embodiments of the present disclosure.

Referring now to FIG. 1, a graphical illustration of a positive TCR curve 102 of a resistor and a negative TCR curve 104 of another resistor are shown in accordance with exemplary embodiments of the present disclosure. The positive TCR curve 102 refers to materials that experience an increase in electrical resistance when their temperature is raised. Materials which have useful engineering applications usually show a relatively rapid increase with temperature, i.e. a higher coefficient. The higher the coefficient, the greater an increase in electrical resistance for a given temperature increase. The negative TCR curve 104 refers to materials that experience a decrease in electrical resistance when their temperature is raised. Materials which have useful engineering applications usually show a relatively rapid decrease with temperature, i.e. a lower coefficient. The lower the coefficient, the greater a decrease in electrical resistance for a given temperature increase.

A resistor that exhibits either positive TCR or negative TCR may be used to adjust the resistance value of the resistor by adjusting the surrounding temperature of the resistor within a certain temperature range.

Figure 2:
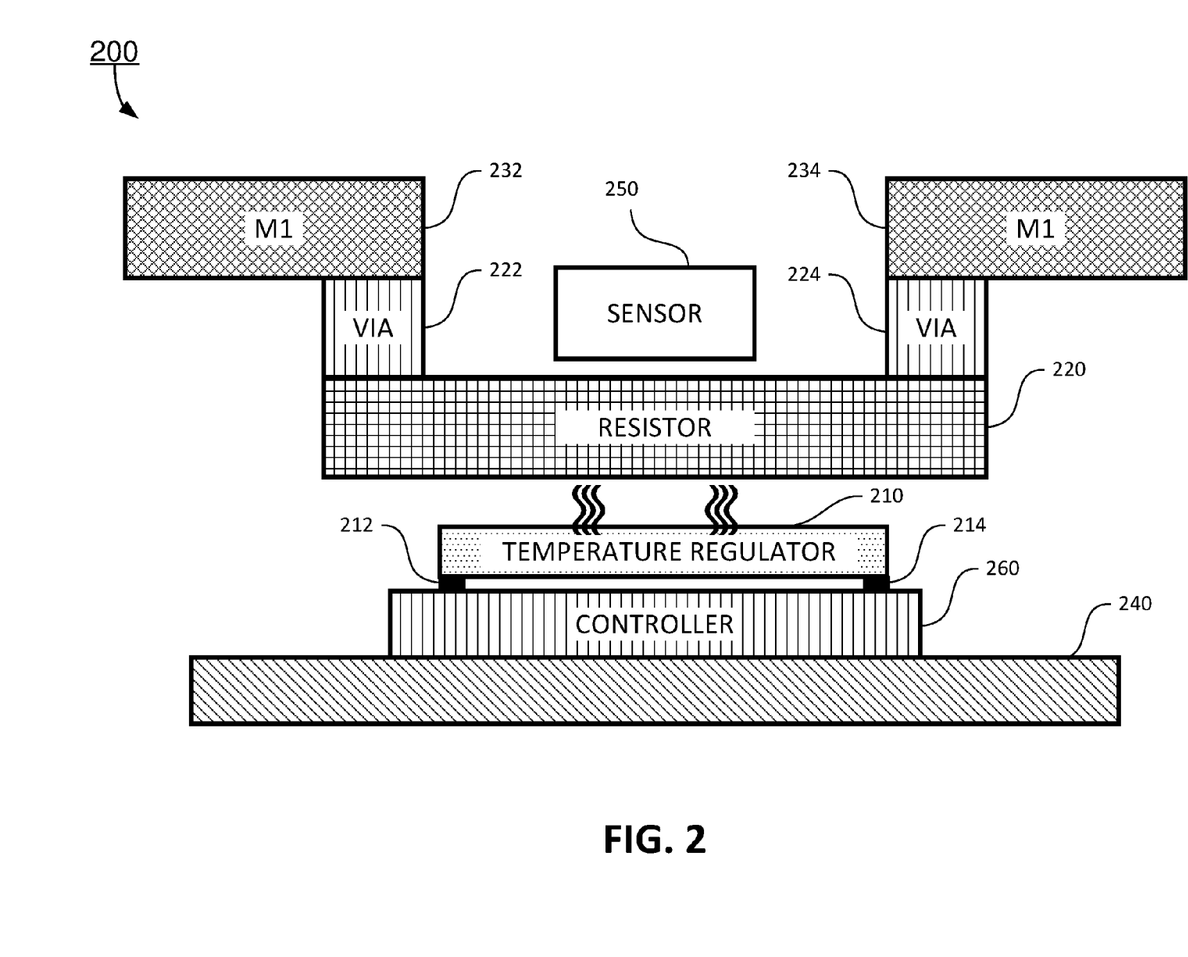
FIG. 2 is a structural view of an exemplary control system for adjusting resistance value of a resistor in accordance with one exemplary embodiment of the present disclosure.

In one aspect, the present disclosure relates to a control system 200 for adjusting a resistance value of a resistor 220 in a circuit. FIG. 2 shows a structural view of the exemplary control system 200 for adjusting resistance value of a resistor 220 in accordance with one exemplary embodiment of the present disclosure. The control system 200 may include: a resistor 220, a temperature regulator 210, a controller (not shown in FIG. 2), and a substrate 240. The resistor 220 has a first terminal electrically coupled to a first via 222, and an opposite, second terminal electrically coupled to a second via 224. The first via 222 is electrically coupled to a first terminal 232 of the resistor 220, and the second via 224 is electrically coupled to a second terminal 234 of the resistor 220. The resistor 220 is a part of an electronic circuit. The electronic circuit may be a discrete electronic circuit, or an integrated circuit.

In certain embodiments, the temperature regulator 210 is a field effect transistor (FET). The temperature regulator 210 may include a gate terminal 212, a source terminal 214, and a drain terminal 216. The temperature regulator 210 may be placed under, or adjacent to the resistor 220, and is used to generate certain amount of heat to change the temperature of the resistor 220 when the temperature regulator 210 is energized by the controller. The control system 200 may include a temperature sensor 250 to measure the temperature of the resistor 220 while the electronic circuit is in operation.

In certain embodiments, the controller is coplanar with temperature regulator 210 and not shown in the cross sectional view. The temperature regulator 210 may include an FET, or an FEOL cooler. In one embodiment, the substrate 240 may be a bulk silicon substrate. In another embodiment, the substrate 240 may be a silicon on insulator (SOI) and silicon substrate.

According to the design of the electronic circuit, the resistor 220 may be given a target resistance value, $R_t$. However, when the resistor 220 is chosen to be installed in a discrete electronic circuit, or is integrated in an integrated circuit (IC) chip, an actual resistance value $R_1$ may not be exactly the same as the target resistance value, $R_t$. The resistance discrepancy $(R_t-R_1)$ may cause the performance of the electronic circuit to deteriorate.

In one embodiment, the temperature sensor 250, the temperature regulator 210, and the controller are placed under or adjacent to the resistor 220 to compensate the resistance discrepancy $(R_t-R_1)$. For example, in one embodiment, the resistance discrepancy $(R_t-R_1)>0$, where the $R_1$ is less than the target resistance $R_t$. The controller should raise the temperature of the resistor 220, hence raise the resistance value of the resistor 220 to compensate the resistance discrepancy $(R_t-R_1)$. The controller first retrieves a set of parameters of the resistor 220 from a non-volatile memory of the electronic circuit. The set of parameters of the resistor 220 may include: the target resistance value $R_t$, an initial resistance value $R_0$ measured at wafer test, an initial temperature associated with the initial resistance value measured at wafer test, and a temperature coefficient of the resistance (TCR) measured at the wafer test. Then the controller detects an operating temperature of the resistor 220 during circuit operation in field using the temperature sensor 250, generates a temperature difference between the operating temperature detected and a target temperature at which the resistor 220 has the target resistance value, produces a control signal responsive to the temperature difference generated, and then applies the control signal to the temperature regulator 210 to adjust the resistance value of the resistor 220 by changing the temperature of the resistor 220 to raise the resistance value of the resistor 220 until the resistance value of the resistor 220 reaches the target resistance $R_t$.

In another embodiment, the resistance discrepancy $(R_t-R_1)<0$, where the $R_1$ is greater than the target resistance $R_t$. The controller should reduce the temperature of the resistor 220, hence reduce the resistance value of the resistor 220 to compensate the resistance discrepancy $(R_t-R_1)$. The controller first retrieves a set of parameters of the resistor 220 from the non-volatile memory of the electronic circuit. Then the controller detects the operating temperature of the resistor 220 during circuit operation in field using the temperature sensor 250, generates a temperature difference between the operating temperature detected and a target temperature at which the resistor 220 has the target resistance value, produces a control signal responsive to the temperature difference generated, and then applies the control signal to the temperature regulator 210 to adjust the resistance value of the resistor 220 by changing the temperature of the resistor 220 to reduce the resistance value of the resistor 220 until the resistance value of the resistor 220 reaches the target resistance $R_t$.

In the embodiments described above, a resistor that has a positive TCR curve is used. The resistance value of the resistor increases as the temperature of the resistor increases. Here an FET heater may be used to change the resistance value of the resistor.

In other embodiments, a resistor that has a negative TCR curve may be used. The resistance value of the resistor decreases as the temperature of the resistor increases. Here a front end of line (FEOL) cooler such as forward biased PN junction Peltier cooler may be used to change the resistance value of the resistor.

Figure 3:
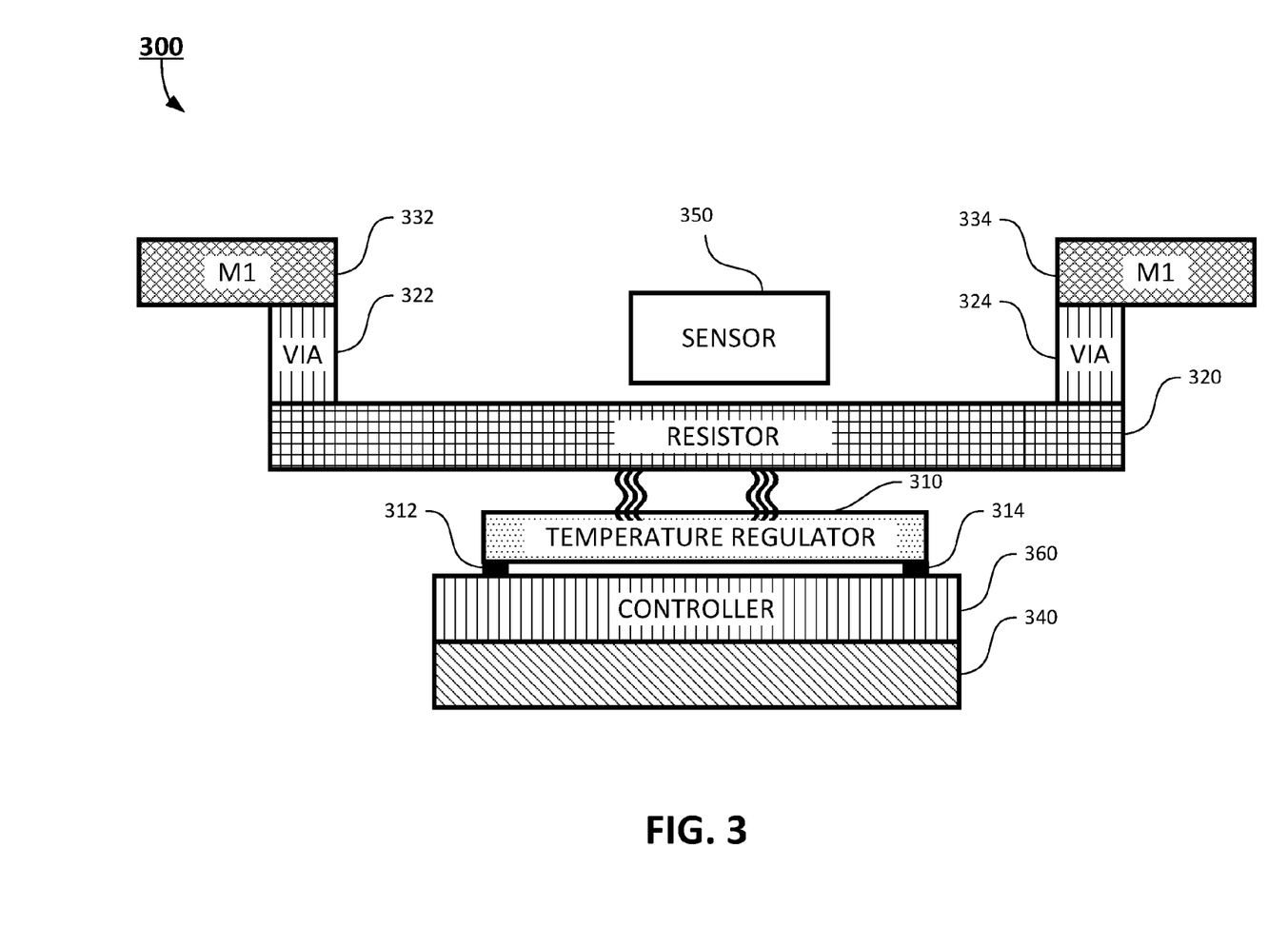
FIG. 3 is a structural view of another exemplary control system for adjusting resistance value of a resistor in accordance with another exemplary embodiment of the present disclosure.

FIG. 3 shows a structural view of another exemplary on-chip control system 300 for adjusting resistance value of a resistor 320 in an integrated circuit in accordance with one exemplary embodiment of the present disclosure. The control system 300 may include: a resistor 320, a temperature regulator 310, a controller 340, and a substrate 340. The resistor 320 has a first terminal electrically coupled to a first via 322, and an opposite, second terminal electrically coupled to a second via 324. The first via 322 is electrically coupled to a first terminal 332 of the resistor 320, and the second via 324 is electrically coupled to a second terminal 334 of the resistor 320. The resistor 320 is a part of the integrated circuit.

In certain embodiments, the controller is coplanar with temperature regulator 310 and not shown in the cross section view. The temperature regulator 310 may include an FET, or an FEOL cooler. In one embodiment, the substrate 340 may be a bulk silicon substrate. In another embodiment, the substrate 340 may be a silicon on insulator (SOI) and silicon substrate.

In certain embodiments, the temperature regulator 310 may be an FET. The temperature regulator 310 may include a gate terminal 312, a source terminal 314, and a drain terminal 316. The temperature regulator 310 may be placed under, or adjacent to the resistor 320, and is used to generate certain amount of heat to change the temperature of the resistor 320 when the temperature regulator 310 is energized by the controller. The control system 300 may include a temperature sensor 350 to measure the temperature of the resistor 320 while the electronic circuit is in operation. The operating principle here are parallel to the ones described in previous sections, and will not be repeated here for brevity reasons.

In certain embodiments, the temperature regulator 310 is biased, and its parasitic capacitance impact can be substantial in the integrated circuit. Due to the distributed nature of parasitic resistance and capacitance (RC), such parasitic capacitance may be neutralized or minimized by placing the temperature regulator 310 in certain location when the integrated circuit is designed. For example, as shown in FIG. 3, the resistor 320 is used in a differential amplifier such as current mode logic (CIVIL). The first terminal 332 of the resistor 320 is electrically coupled to an output terminal of the differential amplifier, and the second terminal 334 of the resistor 320 is electrically coupled to an IC power supply pin VDD or ground (GND). In order to minimize the parasitic capacitance of the integrated circuit, the temperature regulator 310, or the FET, is placed near the second terminal 334, i.e., near IC power supply pin VDD or the ground (GND) to minimize the potential impact of the parasitic capacitance.

Figure 4:
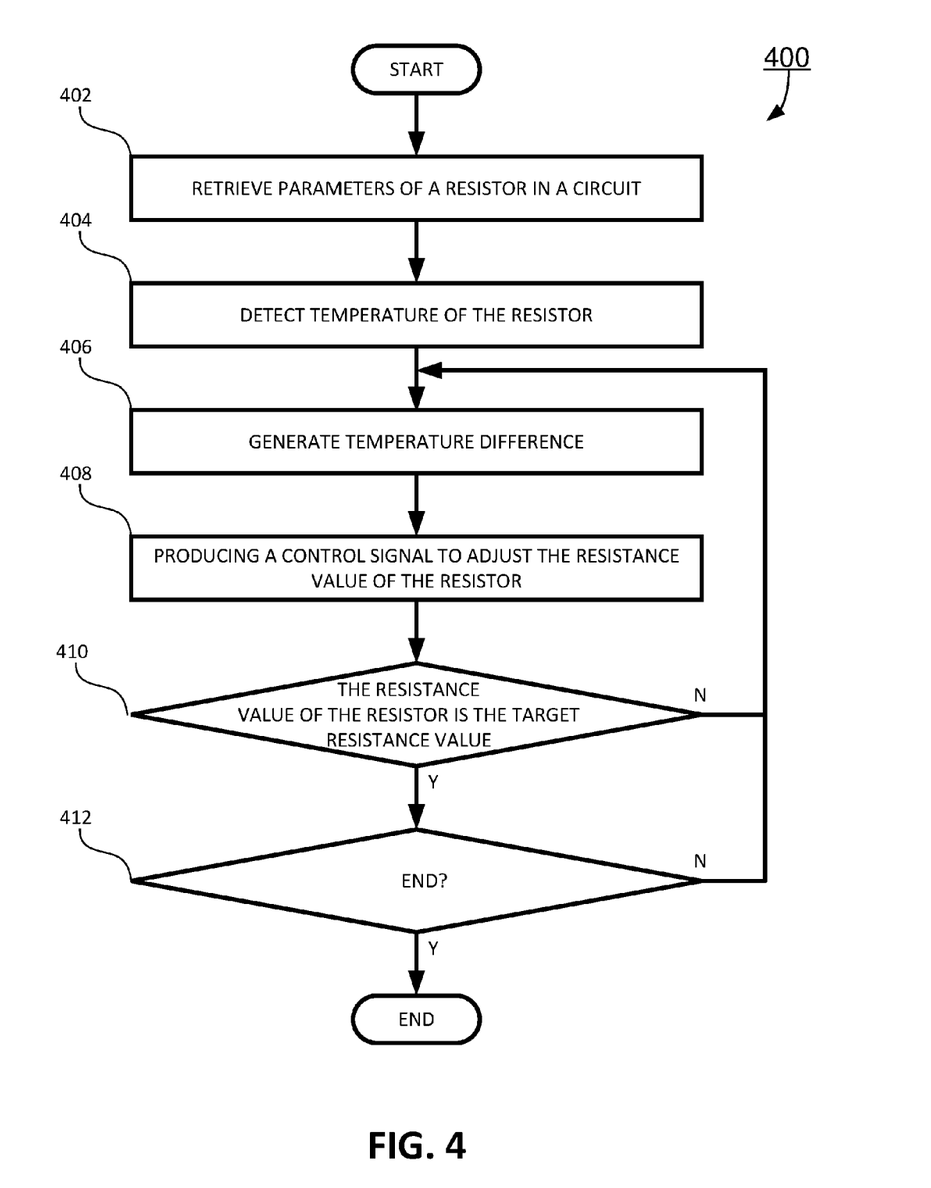
FIG. 4 is a flow chart of an exemplary method of practicing an embodiment of the present disclosure.

In another aspect, the present disclosure relates to a method for controlling resistance value of a resistor 220 in a circuit. Referring now to FIGS. 2 and 4, the structural view of the exemplary control system 200 for adjusting resistance value of the resistor 220 and a flow chart of an exemplary method 400 of adjusting resistance value of the resistor 220 are shown according to certain embodiments of the present disclosure. As shown at block 402, the controller retrieves a set of parameters of the resistor 220. The set of parameters is stored in a non-volatile memory device (not shown in FIG. 2) of the electronic circuit. In certain embodiments, the set of parameters may include: a target resistance value, an initial resistance value measured at wafer test, an initial temperature associated with the initial resistance value measured at the wafer test, and a temperature coefficient of the resistance (TCR). The resistor 220 may be a resistor that has positive temperature coefficient of resistance, or a thermistor. The resistance value of the resistor varies in response to temperature changes around the resistor 220 according to the temperature coefficient of the resistance of the resistor 220.

Next, as shown at block 404, the controller detects current operating temperature of the resistor 220 during circuit operation in field. The controller may use the current operating temperature of the resistor 220 to calculate current resistance value of the resistor 220 according to the temperature coefficient of the resistance of the resistor 220 retrieved through block 402.

As shown at block 406, the controller generates a temperature difference between the current operating temperature detected and a target temperature at which the resistor 220 has the target resistance value. The target temperature is calculated based on the initial resistance value and the temperature coefficient of resistance of the resistor 220.

As shown at block 408, the controller produces a control signal responsive to the temperature difference generated. The controller first decides whether the temperature of the resistor 220 should go up or down based on the temperature difference detected. When the resistor has a positive TCR, and the when the target resistance value is higher than the current resistance value, then the controller may increase the voltage or current to the temperature regulator 210 to increase the resistance value of the resistor 220. When the resistor has a negative TCR, and the when the target resistance value is less than the current resistance value, then the controller may increase the voltage or current to the temperature regulator 210 to decrease the resistance value of the resistor 220.

At block 410, the controller checks whether the current resistance value of the resistor 220 has reached the target resistance value. When the current resistance value of the resistor 220 has reached the target resistance value, then the method 400 continues to block 412. When the current resistance value of the resistor 220 is still greater than or less than the target resistance value, then the method 400 continues to block 406 to continue the resistance value adjustment until the current resistance value of the resistor 220 reaches the target resistance value.

At block 412, the controller continues to monitor and adjust the current resistance value of the resistor 220 when necessary, until the electronic circuit is shut down.

In yet another aspect, the present disclosure relates to a non-transitory computer storage medium. In certain embodiments, the non-transitory computer storage medium stores instructions. When these instructions are executed by a controller in a circuit, these instructions cause the controller to perform: retrieving a set of parameters of a resistor 220 from a non-volatile memory in the circuit, detecting an operating temperature of the resistor 220 during circuit operation in field, generating a temperature difference between the operating temperature and a target temperature at which the resistor 220 has a target resistance value, producing a control signal responsive to the temperature difference generated, and applying the control signal to a temperature regulator 210 placed adjacent to the resistor 220 to adjust the resistance value of the resistor 220.

In certain embodiments, the set of parameters of the resistor 220 may include: the target resistance value, an actual resistance value measured at wafer test, and a temperature coefficient of the resistance at the wafer test. In certain embodiments, the resistance value of the resistor 220 varies in response to temperature changes around the resistor 220 according to the temperature coefficient of the resistance of the resistor 220.

In certain embodiments, the non-transitory computer storage medium may include instructions for detecting the temperature of the resistor 220 using a temperature sensor 250. The temperature regulator 210 may be a field effect transistor (FET) for changing temperature in response to the control signal received from the controller, and a front end of the line (FEOL) cooler for changing temperature in response to the control signal received from the controller.

In certain embodiments, the non-transitory computer storage medium may include instructions for calculating the target temperature of the resistor 220 at which the resistor 220 has the target resistance value according to the actual resistance value and the temperature coefficient of resistance of the resistor 220 measured at wafer test.

The present invention may be a computer system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for controlling resistance value of a resistor in a circuit comprising:
   retrieving, via a controller, a plurality of parameters of the resistor from a non-volatile memory in the circuit;
   detecting, via the controller, an operating temperature of the resistor during circuit operation in field;
   generating, by the controller, a temperature difference between the operating temperature detected and a target temperature at which the resistor has a target resistance value;
   producing, by the controller, a control signal responsive to the temperature difference generated; and
   transmitting the control signal to a temperature regulator placed adjacent to the resistor to control the resistance value of the resistor,
   wherein the temperature regulator comprises a front end of the line (FEOL) cooler configured to change temperature of the resistor in response to the control signal received from the controller.

2. The method of claim 1, wherein the plurality of parameters of the resistor comprises:
   an initial resistance value measured at wafer test;
   an initial temperature associated with the initial resistance value measured at the wafer test;
   the target resistance value; and
   a temperature coefficient of the resistance measured at the wafer test.

3. The method of claim 2, wherein the resistance value of the resistor varies in response to temperature changes around the resistor according to the temperature coefficient of the resistance of the resistor.

4. The method of claim 1, wherein the detecting comprises detecting the operating temperature of the resistor using a temperature sensor.

5. The method of claim 1, wherein the generating comprises calculating the target temperature of the resistor at which the resistor has the target resistance value according to the initial resistance value and the temperature coefficient of resistance of the resistor measured at wafer test.

6. A control system for adjusting a resistance value of a resistor in a circuit comprising:
   the resistor having a plurality of parameters of the resistor stored in a non-volatile memory in the circuit, wherein the plurality of parameters comprises an initial resistance value measured at wafer test, an initial temperature associated with the initial resistance value measured at the wafer test, a target resistance value, and a temperature coefficient of the resistance measured at the wafer test;
   a temperature regulator located adjacent to the resistor; and
   a controller configured to:
      retrieve the plurality of parameters of the resistor from the non-volatile memory in the circuit;
      detect an operating temperature of the resistor during circuit operation in field;
      generate a temperature difference between the operating temperature and a target temperature at which the resistor has the target resistance value;
      produce a control signal responsive to the temperature difference generated; and
      transmit the control signal to the temperature regulator to adjust the resistance value of the resistor,
   wherein the temperature regulator comprises a front end of the line (FEOL) cooler configured to change temperature in response to the control signal received from the controller.

7. The control system of claim 6, wherein the resistance value of the resistor varies in response to temperature changes around the resistor according to the temperature coefficient of the resistance of the resistor.

8. The control system of claim 6, wherein the controller is configured to detect the operating temperature of the resistor using a temperature sensor.

9. The control system of claim 6, wherein the controller is configured to calculate the target temperature of the resistor at which the resistor has the target resistance value according to the initial resistance value and the temperature coefficient of resistance of the resistor measured at wafer test.

10. A circuit comprising the control system of claim 6.

11. A non-transitory computer storage medium having instructions stored thereon which, when executed by a controller in a circuit, cause the controller to perform:
   retrieving a plurality of parameters of a resistor from a non-volatile memory in the circuit;
   detecting an operating temperature of the resistor during circuit operation in field;
   generating a temperature difference between the operating temperature and a target temperature at which the resistor has a target resistance value;
   producing a control signal responsive to the temperature difference generated; and
   transmitting the control signal to a temperature regulator placed adjacent to the resistor to adjust the resistance value of the resistor, wherein the temperature regulator comprises a front end of the line (FEOL) cooler configured to change temperature in response to the control signal received from the controller.

12. The non-transitory computer storage medium of claim 11, wherein the plurality of parameters of the resistor comprises:
   the target resistance value;
   an initial resistance value measured at wafer test;
   an initial temperature associated with the initial resistance value measured at the wafer test; and
   a temperature coefficient of the resistance at the wafer test.

13. The non-transitory computer storage medium of claim 12, wherein the resistance value of the resistor varies in response to temperature changes around the resistor according to the temperature coefficient of the resistance of the resistor.

14. The non-transitory computer storage medium of claim 11, wherein the detecting comprises detecting the operating temperature of the resistor using a temperature sensor.

15. The non-transitory computer storage medium of claim 11, wherein the generating comprises calculating the target temperature of the resistor at which the resistor has the target resistance value according to the initial resistance value and the temperature coefficient of resistance of the resistor measured at wafer test.

* * * * *